United States Patent
Yoon

(10) Patent No.: US 9,438,210 B1
(45) Date of Patent: Sep. 6, 2016

(54) SEMICONDUCTOR DEVICES EMPLOYING A DATA INVERSION SCHEME FOR IMPROVED INPUT/OUTPUT CHARACTERISTICS

(71) Applicant: SK hynix Inc., Icheon-si Gyeonggi-do (KR)

(72) Inventor: Young Jun Yoon, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/808,060

(22) Filed: Jul. 24, 2015

(30) Foreign Application Priority Data

Mar. 31, 2015 (KR) .................. 10-2015-0045750

(51) Int. Cl.
*H03K 3/037* (2006.01)
(52) U.S. Cl.
CPC .................... *H03K 3/037* (2013.01)
(58) Field of Classification Search
CPC .... H03K 3/012; H03K 3/037; H03K 3/0375; H03K 19/0016; H03K 19/0013; H03K 19/00346; H03K 19/21; H03K 5/151; H03K 5/153; H03K 5/1534
USPC ................ 327/142, 143, 156, 158, 198, 212
See application file for complete search history.

(56) References Cited

U.S. PATENT DOCUMENTS

2013/0091327 A1    4/2013   Shido et al.

FOREIGN PATENT DOCUMENTS

KR    1020050058914 A    6/2005

*Primary Examiner* — John Poos
(74) *Attorney, Agent, or Firm* — William Park & Associates Ltd.

(57) ABSTRACT

A semiconductor device may include a data output circuit and a control signal output circuit. The data output circuit may compare a first input signal or a second input signal with a storage datum to generate a first comparison selection signal and may compare the first input signal with the second input signal to generate a second comparison selection signal. The control signal output circuit may detect logic levels of bits included in the first and second comparison selection signals to generate first and second detection signals, generate first and second flag signals from the first and second detection signals in response to a storage flag signal, and sequentially output the first and second flag signals as transmission control signals.

30 Claims, 12 Drawing Sheets

FIG.2

| S_CON | Burst Sequence | | | | |
|---|---|---|---|---|---|
| L | S_DT=DIN4<1> | DIN1<1> | DIN2<1> | DIN3<1> | DIN4<1> |
| H | S_DT=DIN2<1> | DIN3<1> | DIN4<1> | DIN1<1> | DIN2<1> |

FIG.9

|  | PRE OUT | 1st_OUT | 2nd_OUT | 3rd_OUT | 4th_OUT |
|---|---|---|---|---|---|
| DQ<1> | L | H | H | H | L |
| DQ<2> | L | H | H | H | L |
| DQ<3> | L | H | H | H | L |
| DQ<4> | L | H | H | H | L |
| DQ<5> | L | H | L | H | L |
| DQ<6> | L | L | H | L | L |
| DQ<7> | L | L | H | L | L |
| DQ<8> | L | L | H | L | L |
| T_CON | L | L | L | L | L |
| NUMBER OF LEVEL TRANSITION OF 'DQ' | ✗ | 5 | 4 | 4 | 5 |
| NUMBER OF LEVEL TRANSITION OF 'DQ+T_CON' | ✗ | 5 | 4 | 4 | 5 |

FIG.10

|  | PRE OUT | 1st_OUT | 2nd_OUT | 3rd_OUT | 4th_OUT |
|---|---|---|---|---|---|
| DQ<1> | L | L | H | H | H |
| DQ<2> | L | L | H | H | H |
| DQ<3> | L | L | H | H | H |
| DQ<4> | L | L | H | H | H |
| DQ<5> | L | L | L | H | H |
| DQ<6> | L | H | H | L | H |
| DQ<7> | L | H | H | L | H |
| DQ<8> | L | H | H | L | H |
| T_CON | L | H | L | L | H |
| NUMBER OF LEVEL TRANSITION OF 'DQ' | ✕ | 3 | 4 | 4 | 3 |
| NUMBER OF LEVEL TRANSITION OF 'DQ+T_CON' | ✕ | 4 | 5 | 4 | 4 |

FIG.11

|  | PRE OUT | 1st_OUT | 2nd_OUT | 3rd_OUT | 4th_OUT |
|---|---|---|---|---|---|
| DQ<1> | L | L | L | L | L |
| DQ<2> | L | L | L | L | L |
| DQ<3> | L | L | L | L | L |
| DQ<4> | L | L | L | L | L |
| DQ<5> | L | L | H | L | L |
| DQ<6> | L | H | L | H | L |
| DQ<7> | L | H | L | H | L |
| DQ<8> | L | H | L | H | L |
| T_CON | L | H | H | H | L |
| NUMBER OF LEVEL TRANSITION OF 'DQ' | ✕ | 3 | 4 | 4 | 3 |
| NUMBER OF LEVEL TRANSITION OF 'DQ+T_CON' | ✕ | 4 | 4 | 4 | 4 |

SEMICONDUCTOR DEVICES EMPLOYING A DATA INVERSION SCHEME FOR IMPROVED INPUT/OUTPUT CHARACTERISTICS

CROSS-REFERENCE TO RELATED APPLICATIONS

The present application claims priority under 35 U.S.C 119(a) to Korean Application No. 10-2015-0045750, filed on Mar. 31, 2015, in the Korean Intellectual Property Office, which is incorporated herein by reference in its entirety as set forth in full.

BACKGROUND

1. Technical Field

Various embodiments generally relate to semiconductor devices, and more particularly, to semiconductor devices employing a data inversion scheme.

2. Related Art

Recently, a multi-bit pre-fetch scheme has been widely used in semiconductor devices. The semiconductor devices using the multi-bit pre-fetch scheme may generate multi-bit data from memory cells in parallel in response to a single command and may output the multi-bit data in synchronization with a clock signal through a single data input/output (I/O) pin or a plurality of I/O pins. If the multi-bit pre-fetch scheme is used in the semiconductor device, a column path of internal cores of the semiconductor device may be driven at a low frequency. The low frequency is equal to or less than half that of an external clock signal. Thus, the internal cores and the column path of the semiconductor device may be readily designed if the semiconductor device employs the multi-bit pre-fetch scheme.

Meanwhile, as a frequency of the external clock signal increases and the number of data pads through which data are outputted increases, the semiconductor device may be designed to have a wide I/O structure including thirty two or more data pads through which data are simultaneously outputted. If the data are simultaneously outputted through thirty two or more data pads of the semiconductor device, a lot of noise referred to as 'simultaneous switching noise (SSN)' may be generated in the output data and the semiconductor device may suffer from the SSN. The SSN may distort waveforms of the output data to degrade a signal integrity of the semiconductor device. In such a case, it may be difficult to obtain a high performance semiconductor device having an excellent I/O characteristic that high frequency systems require.

SUMMARY

According to an embodiment, a semiconductor device may include a data output circuit and a control signal output circuit. The data output circuit may compare a first input signal with a storage datum to generate a first comparison selection signal and may compare a second input signal with the first input signal to generate a second comparison selection signal, in a first output sequence mode that the first input signal and the second input signal are sequentially outputted as output data. The data output circuit may compare the second input signal with the storage datum to generate the first comparison selection signal and may compare the second input signal with the first input signal to generate the second comparison selection signal, in a second output sequence mode that the second input signal and the first input signal are sequentially outputted as the output data. The control signal output circuit may detect logic levels of bits included in the first and second comparison selection signals to generate a first detection signal and a second detection signal, may generate a first flag signal and a second flag signal from the first and second detection signals in response to a storage flag signal, and may sequentially output the first and second flag signals as transmission control signals.

According to an embodiment, a semiconductor device may include a first pipe latch unit suitable for sequentially latching a first input signal and a second input signal in response to an input control signal and suitable for outputting the latched first and second input signals as pipe latch data in response to an output control signal. The semiconductor device may include a data storage unit suitable for storing the second input signal as a storage datum in a first output sequence mode and suitable for storing the first input signal as the storage datum in a second output sequence mode. The semiconductor device may include a data comparator suitable for comparing the first input signal with the storage datum to generate a first comparison signal, suitable for comparing the second input signal with the first input signal to generate a second comparison signal, and suitable for comparing the second input signal with the storage datum to generate a third comparison signal. The semiconductor device may include a comparison signal selector suitable for outputting the first comparison signal as the first comparison selection signal and outputting the second comparison signal as the second comparison selection signal in the first output sequence mode and suitable for outputting the third comparison signal as the first comparison selection signal and outputting the second comparison signal as the second comparison selection signal in the second output sequence mode. The semiconductor device may include a control signal output circuit suitable for detecting logic levels of bits included in the first and second comparison selection signals to generate a first detection signal and a second detection signal, suitable for generating a first flag signal and a second flag signal from the first and second detection signals in response to a storage flag signal, and suitable for sequentially outputting the first and second flag signals as transmission control signals.

According to an embodiment, a semiconductor device may include a data output circuit, a bit detector, a flag generator, a flag storage unit, a selection flag generator, a first pipe latch unit, and a control signal output unit. The data output circuit may compare a first input signal with a storage datum to generate a first comparison selection signal and may compare a second input signal with the first input signal to generate a second comparison selection signal, in a first output sequence mode that the first input signal and the second input signal are sequentially outputted as output data. The data output circuit may compare the second input signal with the storage datum to generate the first comparison selection signal and may compare the second input signal with the first input signal to generate the second comparison selection signal, in a second output sequence mode that the second input signal and the first input signal are sequentially outputted as the output data. The bit detector may detect logic levels of bits included in the first comparison selection signal to generate a first detection signal and detect logic levels of bits included in the second comparison selection signal to generate a second detection signal. The flag generator may compare the first detection signal with a storage flag signal to generate a first flag signal and compare the first flag signal with the second detection signal to generate a second flag signal. The flag storage unit may store the second flag signal as the storage flag signal in response to a delayed storage control signal. The selection flag generator may output the first flag signal as a first selection flag signal and may output the second flag signal as a second selection flag signal, in the first output sequence mode. The selection flag generator may output the second flag signal as the first selection flag signal and may output the first flag signal as the second selection flag signal in the second output sequence mode. The first pipe latch unit may sequentially latch the first and second selection flag signals in response to a delayed input control signal and may output the latched first and second selection flag signals as inversion control signals in response to a delayed output control signal. The control signal output unit may generate transmission control signals from the inversion control signals in synchronization with an internal clock signal. The transmission control signals may be outputted through a control pad.

BRIEF DESCRIPTION OF THE DRAWINGS

FIG. 2 is a table illustrating examples of various combinations of output sequences of data outputted through data pads according to a burst sequence of the semiconductor device illustrated in FIG. 1.

FIGS. 9, 10 and 11 are tables illustrating examples of operations of a data inversion scheme employed in the semiconductor device of FIG. 1.

DETAILED DESCRIPTION

In general, a data inversion scheme may be used in semiconductor devices to improve the I/O characteristic of the semiconductor devices employed in the high frequency systems.

The data inversion scheme may be used to reduce the SSN of the semiconductor devices. The semiconductor devices using the data inversion scheme may compare the current output data (generally, having eight bits) with the previous output data to count the number of bits toggled and may actually output the current output data as they are or inverse data of the current output data according to the number of the toggled bits. If the data inversion scheme is used in the semiconductor devices, the number of the toggled bits among the actual output data may always be less than half the number of all bits of the output data. Accordingly, the SSN may be reduced to improve the signal integrity of the semiconductor device. As a result, the I/O characteristic of the semiconductor devices may be enhanced to realize high performance semiconductor devices.

Various embodiments of the present disclosure will be described hereinafter with reference to the accompanying drawings. However, the embodiments described herein are for illustrative purposes only and are not intended to limit the scope of the present disclosure. Various embodiments may be directed to semiconductor devices employing a data inversion scheme.

Figure 1:
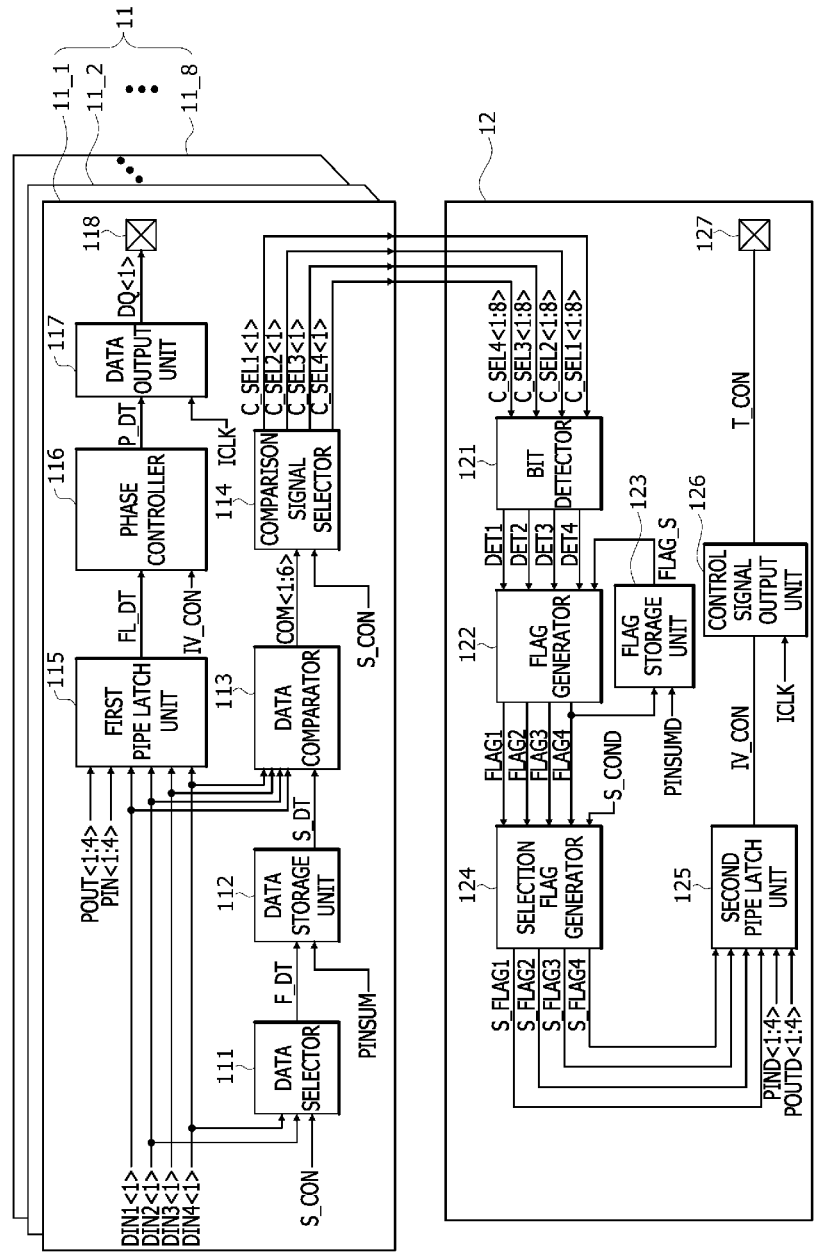
FIG. 1 is a block diagram illustrating a representation of an example of a configuration of a semiconductor device according to an embodiment.

Referring to FIG. 1, a semiconductor device according to an embodiment may include a data output circuit group 11 and a control signal output circuit 12. The data output circuit group 11 may include first to eighth data output circuits 11_1, 11_2, . . . , and 11_8. The first data output circuit 11_1 may include a data selector 111, a data storage unit 112, a data comparator 113, a comparison signal selector 114, a first pipe latch unit 115, a phase controller 116, a data output unit 117 and a data pad 118. The control signal output circuit 12 may include a bit detector 121, a flag generator 122, a flag storage unit 123, a selection flag generator 124, a second pipe latch unit 125, a control signal output unit 126 and a control pad 127.

The data selector 111 may select any one among first to fourth input signals DIN1<1>, DIN2<1>, DIN3<1> and DIN4<1> sequentially inputted thereto in response to a selection control signal S_CON as a final datum F_DT. The selection control signal S_CON may have a logic level set according to a burst sequence including information on a sequence that the first to fourth input signals DIN1<1>, DIN2<1>, DIN3<1> and DIN4<1> are transmitted to the data pad 118 through the first pipe latch unit 115, the phase controller 116 and the data output unit 117.

The data storage unit 112 may output the final datum F_DT as a storage datum S_DT in response to a storage control signal PINSUM. The storage control signal PINSUM may be set to be enabled according to enablement states of first to fourth input control signals PIN<1:4>. For example, the storage control signal PINSUM may be enabled after all of the first to fourth input signals DIN1<1>, DIN2<1>, DIN3<1> and DIN4<1> are inputted to the first pipe latch unit 115 while all of the first to fourth input control signals PIN<1:4> are enabled. Enabled logic levels of the storage control signal PINSUM and the first to fourth input control signals PIN<1:4> may be set to be different according to the various embodiments.

The data comparator 113 may compare two signals selected from the storage datum S_DT and the first to fourth input signals DIN1<1>, DIN2<1>, DIN3<1> and DIN4<1> according to the burst sequence, thereby generating first to sixth comparison signals COM<1:6>. A configuration and an operation of the data comparator 113 will be described more fully with reference to FIGS. 2 and 3 later.

The comparison signal selector 114 may select some signals among the first to sixth comparison signals COM<1:6> in response to the selection control signal S_CON to output the selected signals as first to fourth comparison selection signals C_SEL1<1>, C_SEL2<1>, C_SEL3<1> and C_SEL4<1>, respectively. For example, the comparison signal selector 114 may select some signals corresponding to the first to fourth comparison selection signals C_SEL1<1>, C_SEL2<1>, C_SEL3<1> and C_SEL4<1> from the first to sixth comparison signals COM<1:6> according to the burst sequence. A configuration and an operation of the comparison signal selector 114 will be described with reference to FIG. 4 later.

The first pipe latch unit 115 may output the first to fourth input signals DIN1<1>, DIN2<1>, DIN3<1> and DIN4<1> as pipe latch data FL_DT in response to the first to fourth input control signals PIN<1:4> and first to fourth output control signals POUT<1:4>. The first pipe latch unit 115 may receive and latch the first input signal DIN1<1> if the first input control signal PIN<1> is enabled. The first pipe latch unit 115 may receive and latch the second input signal DIN2<1> if the second input control signal PIN<2> is enabled. The first pipe latch unit 115 may receive and latch the third input signal DIN3<1> if the third input control signal PIN<3> is enabled. The first pipe latch unit 115 may receive and latch the fourth input signal DIN4<1> if the fourth input control signal PIN<4> is enabled. The first pipe latch unit 115 may output the latched first input signal DIN1<1> as the pipe latch data FL_DT if the first output control signal POUT<1> is enabled. The first pipe latch unit 115 may output the latched second input signal DIN2<1> as the pipe latch data FL_DT if the second output control signal POUT<2> is enabled. The first pipe latch unit 115 may output the latched third input signal DIN3<1> as the pipe latch data FL_DT if the third output control signal POUT<3> is enabled. The first pipe latch unit 115 may output the latched fourth input signal DIN4<1> as the pipe latch data FL_DT if the fourth output control signal POUT<4> is enabled. Enabled logic levels of the first to fourth input control signals PIN<1:4> and the first to fourth output control signals POUT<1:4> may be set to be different according to the various embodiments. The first pipe latch unit 115 may convert the first to fourth input signals DIN1<1>, DIN2<1>, DIN3<1> and DIN4<1> inputted in parallel thereto into the pipe latch data FL_DT outputted therefrom in series. A sequence of the first to fourth input signals DIN1<1>, DIN2<1>, DIN3<1> and DIN4<1> outputted as the pipe latch data FL_DT may be determined according to the burst sequence.

The phase controller 116 may determine a phase inversion of the pipe latch data FL_DT in response to an inversion control signal IV_CON to generate a phase data P_DT. If the inversion control signal IV_CON is enabled, the phase controller 116 may invert a phase of the pipe latch data FL_DT to output the inverted signal of the pipe latch data FL_DT as the phase data P_DT. A configuration and an operation of the phase controller 116 will be described with reference to FIG. 5 later.

The data output unit 117 may output the phase data P_DT as a first output data DQ<1> in synchronization with an internal clock signal ICLK. The first output data DQ<1> may be outputted out of the semiconductor device through the data pad 118. The internal clock signal ICLK may be generated in the semiconductor device to output the data. The internal clock signal ICLK may be generated from an external clock signal.

The second to eighth data output circuits 11_2, . . . , and 11_8 may receive input signals DIN1<2:8>, DIN2<2:8>, DIN3<2:8> and DIN4<2:8> to generate and output first to fourth comparison selection signals C_SEL1<2:8>, C_SEL2<2:8>, C_SEL3<2:8> and C_SEL4<2:8> and second to eighth output data DQ<2:8>. A configuration and an operation of each of the second to eighth data output circuits 11_2, . . . , and 11_8 may be substantially the same as the first data output circuit 11_1 described above. Thus, a detailed description of the second to eighth data output circuits 11_2, . . . , and 11_8 will be omitted hereinafter to avoid duplicate explanations.

The bit detector 121 may detect logic levels of bits included in the first comparison selection signals C_SEL1<1:8> to generate a first detection signal DET1. For example, if the number of a logic "high (also, referred to as 'H')" level among the logic levels of the bits included in the first comparison selection signals C_SEL1<1:8> is equal to or greater than five, the bit detector 121 may output the first detection signal DET1 enabled to have a logic "high" level. The bit detector 121 may detect logic levels of bits included in the second comparison selection signals C_SEL2<1:8> to generate a second detection signal DET2. The bit detector 121 may detect logic levels of bits included in the third comparison selection signals C_SEL3<1:8> to generate a third detection signal DET3. The bit detector 121 may detect logic levels of bits included in the fourth comparison selection signals C_SEL4<1:8> to generate a fourth detection signal DET4. A configuration and an operation of the bit detector 121 will be described with reference to FIG. 6 later.

The flag generator 122 may compare a logic level of the first detection signal DET1 with a logic level of a storage flag signal FLAG_S to generate a first flag signal FLAG1. For example, the flag generator 122 may generate the first flag signal FLAG1 having a logic "high" level if a logic level of the first detection signal DET1 is different from a logic level of the storage flag signal FLAG_S. The flag generator 122 may generate the first flag signal FLAG1 having a logic "low" level if a logic level of the first detection signal DET1 is identical to a logic level of the storage flag signal FLAG_S. The flag generator 122 may compare a logic level of the second detection signal DET2 with a logic level of the first detection signal DET1 to generate a second flag signal FLAG2. The flag generator 122 may compare a logic level of the third detection signal DET3 with a logic level of the second detection signal DET2 to generate a third flag signal FLAG3. The flag generator 122 may compare a logic level of the fourth detection signal DET4 with a logic level of the third detection signal DET3 to generate a fourth flag signal FLAG4. A configuration and an operation of the flag generator 122 will be described with reference to FIG. 7 later.

The flag storage unit 123 may store the fourth flag signal FLAG4 therein and may output the stored fourth flag signal FLAG4 as the storage flag signal FLAG_S, in response to a delayed storage control signal PINSUMD. The delayed storage control signal PINSUMD may be generated by retarding the storage control signal PINSUM by a predetermined delay time. The predetermined delay time of the storage control signal PINSUM for generating the delayed storage control signal PINSUMD may be set as operating periods of the data storage unit 112, the data comparator 113, the comparison signal selector 114, the bit detector 121 and the flag generator 122.

The selection flag generator 124 may output the first to fourth flag signals FLAG1, FLAG2, FLAG3 and FLAG4 sequentially inputted thereto as first to fourth selection flag signals S_FLAG1, S_FLAG2, S_FLAG3 and S_FLAG4, in response to a delayed selection control signal S_COND. For example, the selection flag generator 124 may output each of the first to fourth flag signals FLAG1, FLAG2, FLAG3 and FLAG4 as any one of the first to fourth selection flag signals S_FLAG1, S_FLAG2, S_FLAG3 and S_FLAG4 according to the burst sequence set by the delayed selection control signal S_COND. The delayed selection control signal S_COND may be generated by retarding the selection control signal S_CON by a predetermined delay time. The predetermined delay time of the selection control signal S_CON for generating the delayed selection control signal S_COND may be set as operating periods of the data selector 111, the data storage unit 112, the data comparator 113, the comparison signal selector 114, the bit detector 121 and the flag generator 122. A configuration and an operation of the selection flag generator 124 will be described with reference to FIG. 8 later.

The second pipe latch unit 125 may output the first to fourth selection flag signals S_FLAG1, S_FLAG2, S_FLAG3 and S_FLAG4 as inversion control signals IV_CON in response to first to fourth delayed input control signals PIND<1:4> and first to fourth delayed output control signals POUTD<1:4>. The second pipe latch unit 125 may receive and latch the first selection flag signal S_FLAG1 if the first delayed input control signal PIND<1> is enabled. The second pipe latch unit 125 may receive and latch the second selection flag signal S_FLAG2 if the second delayed input control signal PIND<2> is enabled. The second pipe latch unit 125 may receive and latch the third selection flag signal S_FLAG3 if the third delayed input control signal PIND<3> is enabled. The second pipe latch unit 125 may receive and latch the fourth selection flag signal S_FLAG4 if the fourth delayed input control signal PIND<4> is enabled. The second pipe latch unit 125 may output the latched first selection flag signal S_FLAG1 as the inversion control signal IV_CON if the first delayed output control signal POUTD<1> is enabled. The second pipe latch unit 125 may output the latched second selection flag signal S_FLAG2 as the inversion control signal IV_CON if the second delayed output control signal POUTD<2> is enabled. The second pipe latch unit 125 may output the latched third selection flag signal S_FLAG3 as the inversion control signal IV_CON if the third delayed output control signal POUTD<3> is enabled. The second pipe latch unit 125 may output the latched fourth selection flag signal S_FLAG4 as the inversion control signal IV_CON if the fourth delayed output control signal POUTD<4> is enabled. The first to fourth delayed input control signals PIND<1:4> may be generated by retarding the first to fourth input control signals PIN<1:4> by a predetermined delay time. The first to fourth delayed output control signals POUTD<1:4> may be generated by retarding the first to fourth output control signals POUT<1:4> by a predetermined delay time. Enabled logic levels of the first to fourth delayed input control signals PIND<1:4> and the first to fourth delayed output control signals POUTD<1:4> may be set to be different according to the various embodiments. The second pipe latch unit 125 may convert the first to fourth selection flag signals S_FLAG1, S_FLAG2, S_FLAG3 and S_FLAG4 inputted in parallel thereto into the inversion control signals IV_CON outputted therefrom in series. A sequence of the first to fourth selection flag signals S_FLAG1, S_FLAG2, S_FLAG3 and S_FLAG4 outputted as the inversion control signals IV_CON may be determined according to the burst sequence.

The control signal output unit 126 may output the inversion control signals IV_CON as transmission control signals T_CON in synchronization with the internal clock signal ICLK. The transmission control signals T_CON may be outputted out of the semiconductor device through the control pad 127.

Referring to FIG. 2, the burst sequence, that is, information on a sequence that the first to fourth input signals DIN1<1>, DIN2<1>, DIN3<1> and DIN4<1> sequentially inputted to the first data output circuit 11_1 are transmitted to the data pad 118 through the first pipe latch unit 115, the phase controller 116 and the data output unit 117 are listed according to a level of the selection control signal S_CON. For example, if the selection control signal S_CON has a logic "low" level (i.e., L), the first to fourth input signals DIN1<1>, DIN2<1>, DIN3<1> and DIN4<1> sequentially inputted to the first data output circuit 11_1 may be transmitted to the data pad 118 in the same sequence as that the first to fourth input signals DIN1<1>, DIN2<1>, DIN3<1> and DIN4<1> are inputted to the first data output circuit 11_1. In such an example, the fourth input signal DIN4<1> finally inputted to the first data output circuit 11_1 may be stored as the storage datum S_DT. After the fourth input signal DIN4<1> is stored as the storage datum S_DT, the first to fourth input signals DIN1<1>, DIN2<1>, DIN3<1> and DIN4<1> may be transmitted to the data pad 118 through the first pipe latch unit 115, the phase controller 116 and the data output unit 117. For example, if the selection control signal S_CON has a logic "high" level (i.e., H), the first to fourth input signals DIN1<1>, DIN2<1>, DIN3<1> and DIN4<1> sequentially inputted to the first data output circuit 11_1 may be converted by the first pipe latch unit 115 into the pipe latch data FL_DT including the third, fourth, first and second input signals DIN3<1>, DIN4<1>, DIN1<1> and DIN2<1> which are sequentially outputted from the first pipe latch unit 115. The pipe latch data FL_DT may be transmitted to the data pad 118 through the phase controller 116 and the data output unit 117. In such an example, the second input signal DIN2<1>, finally outputted from the first pipe latch unit 115, may be stored as the storage datum S_DT. After the second input signal DIN2<1> is stored as the storage datum S_DT, the first pipe latch unit 115 may convert the first to fourth input signals DIN1<1>, DIN2<1>, DIN3<1> and DIN4<1> sequentially inputted thereto into the pipe latch data FL_DT including the third, fourth, first and second input signals DIN3<1>, DIN4<1>, DIN1<1> and DIN2<1> sequentially outputted therefrom.

Figure 3:
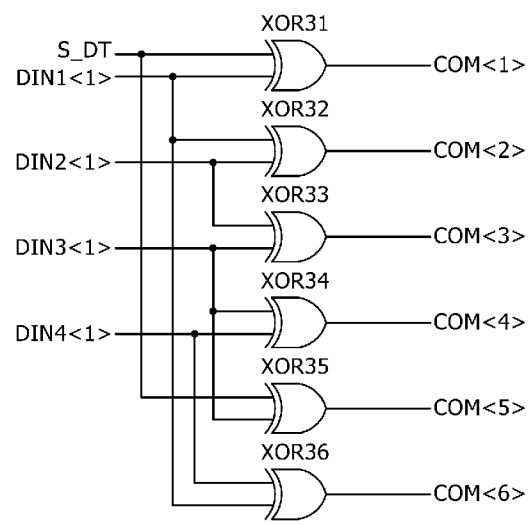
FIG. 3 is a logic circuit diagram illustrating a representation of an example of a data comparator included in the semiconductor device of FIG. 1.

Referring to FIG. 3, the data comparator 113 may include logic elements XOR31~XOR36. The logic element XOR31 may execute an exclusive OR operation of the storage datum S_DT and the first input signal DIN1<1> to generate and output the first comparison signal COM<1>. The logic element XOR31 may output the first comparison signal COM<1> having a logic "high" level if the first input signal DIN1<1> is different from the storage datum S_DT. The logic element XOR31 may output the first comparison signal COM<1> having a logic "low" level if the first input signal DIN1<1> is identical to the storage datum S_DT. The logic element XOR32 may execute an exclusive OR operation of the first input signal DIN1<1> and the second input signal DIN2<1> to generate and output the second comparison signal COM<2>. The logic element XOR32 may output the second comparison signal COM<2> having a logic "high" level if the second input signal DIN2<1> is different from the first input signal DIN1<1>. The logic element XOR32 may output the second comparison signal COM<2> having a logic "low" level if the second input signal DIN2<1> is identical to the first input signal DIN1<1>. The logic element XOR33 may execute an exclusive OR operation of the second input signal DIN2<1> and the third input signal DIN3<1> to generate and output the third comparison signal COM<3>. The logic element XOR33 may output the third comparison signal COM<3> having a logic "high" level if the third input signal DIN3<1> is different from the second input signal DIN2<1>. The logic element XOR33 may output the third comparison signal COM<3> having a logic "low" level if the third input signal DIN3<1> is identical to the second input signal DIN2<1>. The logic element XOR34 may execute an exclusive OR operation of the third input signal DIN3<1> and the fourth input signal DIN4<1> to generate and output the fourth comparison signal COM<4>. The logic element XOR34 may output the fourth comparison signal COM<4> having a logic "high" level if the fourth input signal DIN4<1> is different from the third input signal DIN3<1>. The logic element XOR34 may output the fourth comparison signal COM<4> having a logic "low" level if the fourth input signal DIN4<1> is identical to the third input signal DIN3<1>. The logic element XOR35 may execute an exclusive OR operation of the third input signal DIN3<1> and the storage datum S_DT to generate and output the fifth comparison signal COM<5>. The logic element XOR35 may output the fifth comparison signal COM<5> having a logic "high" level if the third input signal DIN3<1> is different from the storage datum S_DT. The logic element XOR35 may output the fifth comparison signal COM<5> having a logic "low" level if the third input signal DIN3<1> is identical to the storage datum S_DT. The logic element XOR36 may execute an exclusive OR operation of the fourth input signal DIN4<1> and the first input signal DIN1<1> to generate and output the sixth comparison signal COM<6>. The logic element XOR36 may output the sixth comparison signal COM<6> having a logic "high" level if the fourth input signal DIN4<1> is different from the first input signal DIN1<1>. The logic element XOR36 may output the sixth comparison signal COM<6> having a logic "low" level if the fourth input signal DIN4<1> is identical to the first input signal DIN1<1>.

Figure 4:
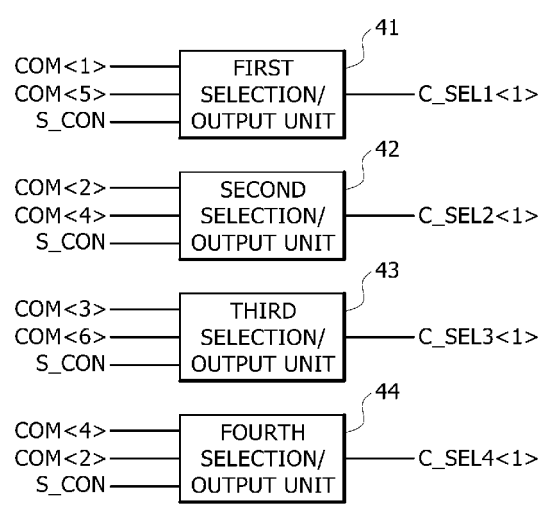
FIG. 4 is a block diagram illustrating a representation of an example of a comparison signal selector included in the semiconductor device of FIG. 1.

Referring to FIG. 4, the comparison signal selector 114 may include a first selection/output unit 41, a second selection/output unit 42, a third selection/output unit 43 and a fourth selection/output unit 44. The first selection/output unit 41 may output the first comparison signal COM<1> as the first comparison selection signal C_SEL1<1> if, for example, the selection control signal S_CON has a logic "low" level. The first selection/output unit 41 may output the fifth comparison signal COM<5> as the first comparison selection signal C_SEL1<1> if, for example, the selection control signal S_CON has a logic "high" level. The second selection/output unit 42 may output the second comparison signal COM<2> as the second comparison selection signal C_SEL2<1> if, for example, the selection control signal S_CON has a logic "low" level. The second selection/output unit 42 may output the fourth comparison signal COM<4> as the second comparison selection signal C_SEL2<1> if, for example, the selection control signal S_CON has a logic "high" level. The third selection/output unit 43 may output the third comparison signal COM<3> as the third comparison selection signal C_SEL3<1> if, for example, the selection control signal S_CON has a logic "low" level. The third selection/output unit 43 may output the sixth comparison signal COM<6> as the third comparison selection signal C_SEL3<1> if, for example, the selection control signal S_CON has a logic "high" level. The fourth selection/output unit 44 may output the fourth comparison signal COM<4> as the fourth comparison selection signal C_SEL4<1> if, for example, the selection control signal S_CON has a logic "low" level. The fourth selection/output unit 44 may output the second comparison signal COM<2> as the fourth comparison selection signal C_SEL4<1> if, for example, the selection control signal S_CON has a logic "high" level.

Figure 5:
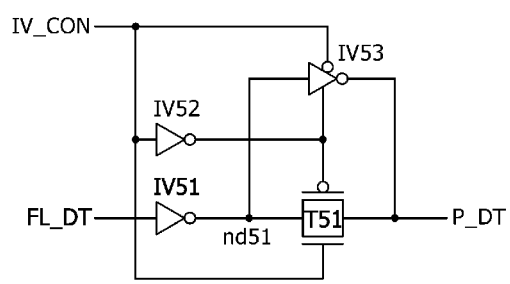
FIG. 5 is a logic circuit diagram illustrating a representation of an example of a phase controller included in the semiconductor device of FIG. 1.

Referring to FIG. 5, the phase controller 116 may include inverters IV51, IV52 and IV53 and a transfer gate T51. The inverter IV51 may inversely buffer the pipe latch data FL_DT. The inverter IV51 may output the inversely buffered data of the pipe latch data FL_DT to a node ND51. The inverter IV52 may inversely buffer the inversion control signal IV_CON. The inverter IV52 may output the inversely buffered signal of the inversion control signal IV_CON. The inverter IV53 may inversely buffer a signal of the node ND51 to output the inversely buffered signal of the node ND51 as phase data P_DT if, for example, the inversion control signal IV_CON is disabled to have a logic "low" level. The transfer gate T51 may output the signal of the node ND51 as the phase data P_DT if, for example, the inversion control signal IV_CON is enabled to have a logic "high" level. The phase controller 116 may buffer the pipe latch data FL_DT using the inverters IV_51 and IV_53 to output the buffered data of the pipe latch data FL_DT as the phase data P_DT if, for example, the inversion control signal IV_CON is disabled to have a logic "low" level. The phase controller 116 may inversely buffer the pipe latch data FL_DT using the inverter IV_51 and may output the inversely buffered data of the pipe latch data FL_DT as the phase data P_DT using the transfer gate T51 if, for example, the inversion control signal IV_CON is enabled to have a logic "high" level.

Figure 6:
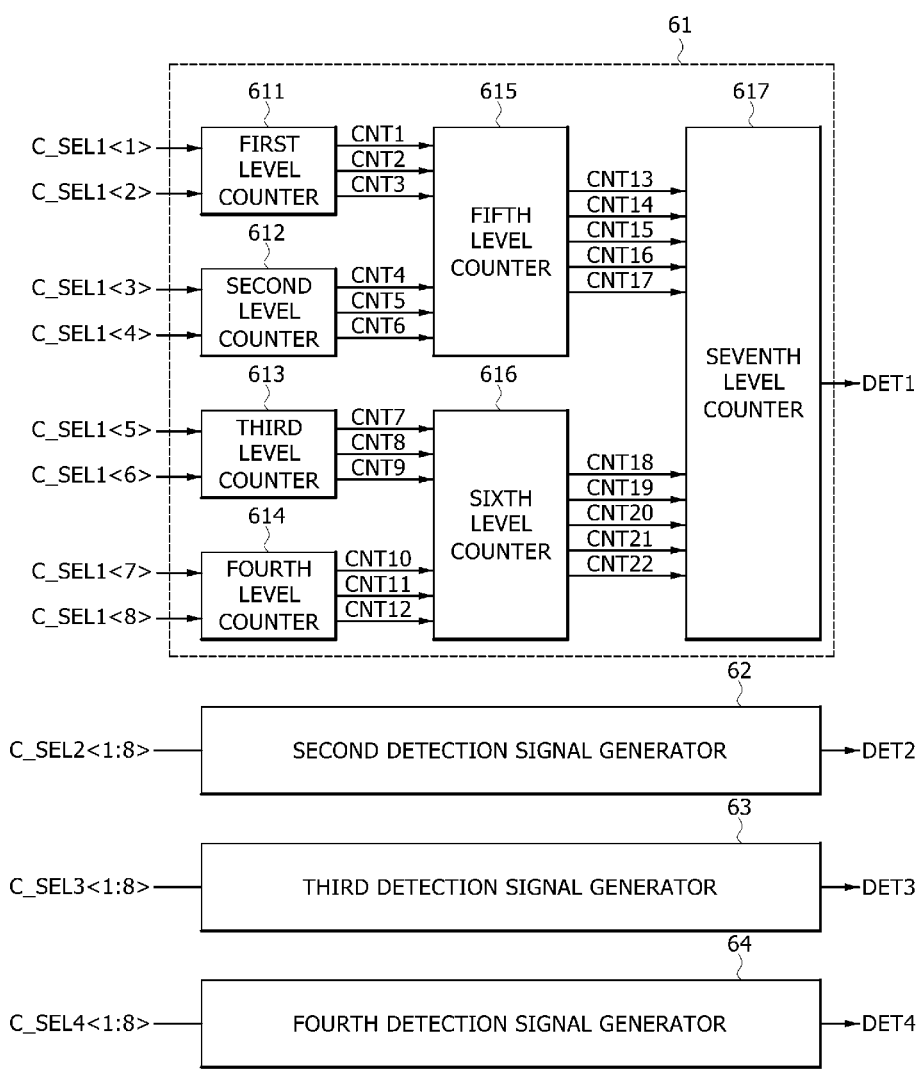
FIG. 6 is a block diagram illustrating a representation of an example of a bit detector included in the semiconductor device of FIG. 1.

Referring to FIG. 6, the bit detector 121 may include a first detection signal generator 61, a second detection signal generator 62, a third detection signal generator 63 and a fourth detection signal generator 64. The first detection signal generator 61 may include a first level counter 611, a second level counter 612, a third level counter 613, a fourth level counter 614, a fifth level counter 615, a sixth level counter 616 and a seventh level counter 617. The first level counter 611 may generate a first count signal CNT1 enabled to have a logic "high" level if, for example, the first and second bits C_SEL1<1:2> included in the first comparison selection signals C_SEL1<1:8> have no logic "high (H)" level. The first level counter 611 may generate a second count signal CNT2 enabled to have a logic "high" level if, for example, any one of the first and second bits C_SEL1<1:2> included in the first comparison selection signals C_SEL1<1:8> has a logic "high (H)" level. The first level counter 611 may generate a third count signal CNT3 enabled to have a logic "high" level if, for example, each of the first and second bits C_SEL1<1:2> included in the first comparison selection signals C_SEL1<1:8> has a logic "high" level. The second level counter 612 may generate a fourth count signal CNT4 enabled to have a logic "high" level if, for example, the third and fourth bits C_SEL1<3:4> included in the first comparison selection signals C_SEL1<1:8> have no logic "high (H)" level. The second level counter 612 may generate a fifth count signal CNT5 enabled to have a logic "high" level if, for example, any one of the third and fourth bits C_SEL1<3:4> included in the first comparison selection signals C_SEL1<1:8> has a logic "high (H)" level. The second level counter 612 may generate a sixth count signal CNT6 enabled to have a logic "high" level if, for example, each of the third and fourth bits C_SEL1<3:4> included in the first comparison selection signals C_SEL1<1:8> has a logic "high" level. The third level counter 613 may generate a seventh count signal CNT7 enabled to have a logic "high" level if, for example, the fifth and sixth bits C_SEL1<5:6> included in the first comparison selection signals C_SEL1<1:8> have no logic "high (H)" level. The third level counter 613 may generate an eighth count signal CNT8 enabled to have a logic "high" level if, for example, any one of the fifth and sixth bits C_SEL1<5:6> included in the first comparison selection signals C_SEL1<1:8> has a logic "high (H)" level. The third level counter 613 may generate a ninth count signal CNT9 enabled to have a logic "high" level if, for example, each of the fifth and sixth bits C_SEL1<5:6> included in the first comparison selection signals C_SEL1<1:8> has a logic "high" level. The fourth level counter 614 may generate a tenth count signal CNT10 enabled to have a logic "high" level if, for example, the seventh and eighth bits C_SEL1<7:8> included in the first comparison selection signals C_SEL1<1:8> have no logic "high (H)" level. The fourth level counter 614 may generate an eleventh count signal CNT11 enabled to have a logic "high" level if, for example, any one of the seventh and eighth bits C_SEL1<7:8> included in the first comparison selection signals C_SEL1<1:8> has a logic "high (H)" level. The fourth level counter 614 may generate a twelfth count signal CNT12 enabled to have a logic "high" level if, for example, each of the seventh and eighth bits C_SEL1<7:8> included in the first comparison selection signals C_SEL1<1:8> has a logic "high" level.

The fifth level counter 615 may receive the first to sixth count signals CNT1, CNT2, CNT3, CNT4, CNT5 and CNT6 to generate a thirteenth count signal CNT13 enabled to have a logic "high" level if, for example, the first to fourth bits C_SEL1<1:4> included in the first comparison selection signals C_SEL1<1:8> have no logic "high (H)" level. The fifth level counter 615 may receive the first to sixth count signals CNT1, CNT2, CNT3, CNT4, CNT5 and CNT6 to generate a fourteenth count signal CNT14 enabled to have a logic "high" level if, for example, one of the first to fourth bits C_SEL1<1:4> included in the first comparison selection signals C_SEL1<1:8> has a logic "high (H)" level. The fifth level counter 615 may receive the first to sixth count signals CNT1, CNT2, CNT3, CNT4, CNT5 and CNT6 to generate a fifteenth count signal CNT15 enabled to have a logic "high" level if, for example, two of the first to fourth bits C_SEL1<1:4> included in the first comparison selection signals C_SEL1<1:8> have a logic "high (H)" level. The fifth level counter 615 may receive the first to sixth count signals CNT1, CNT2, CNT3, CNT4, CNT5 and CNT6 to generate a sixteenth count signal CNT16 enabled to have a logic "high" level if, for example, three of the first to fourth bits C_SEL1<1:4> included in the first comparison selection signals C_SEL1<1:8> have a logic "high (H)" level. The fifth level counter 615 may receive the first to sixth count signals CNT1, CNT2, CNT3, CNT4, CNT5 and CNT6 to generate a seventeenth count signal CNT17 enabled to have a logic "high" level if, for example, each of the first to fourth bits C_SEL1<1:4> included in the first comparison selection signals C_SEL1<1:8> has a logic "high (H)" level.

The sixth level counter 616 may receive the seventh to twelfth count signals CNT7, CNT8, CNT9, CNT10, CNT11 and CNT12 to generate an eighteenth count signal CNT18 enabled to have a logic "high" level if, for example, the fifth to eighth bits C_SEL1<4:8> included in the first comparison selection signals C_SEL1<1:8> have no logic "high (H)" level. The sixth level counter 616 may receive the seventh to twelfth count signals CNT7, CNT8, CNT9, CNT10, CNT11 and CNT12 to generate a nineteenth count signal CNT19 enabled to have a logic "high" level if, for example, one of the fifth to eighth bits C_SEL1<4:8> included in the first comparison selection signals C_SEL1<1:8> has a logic "high (H)" level. The sixth level counter 616 may receive the seventh to twelfth count signals CNT7, CNT8, CNT9, CNT10, CNT11 and CNT12 to generate a twentieth count signal CNT20 enabled to have a logic "high" level if, for example, two of the fifth to eighth bits C_SEL1<4:8> included in the first comparison selection signals C_SEL1<1:8> have a logic "high (H)" level. The sixth level counter 616 may receive the seventh to twelfth count signals CNT7, CNT8, CNT9, CNT10, CNT11 and CNT12 to generate a twenty first count signal CNT21 enabled to have a logic "high" level if, for example, three of the fifth to eighth bits C_SEL1<4:8> included in the first comparison selection signals C_SEL1<1:8> have a logic "high (H)" level. The sixth level counter 616 may receive the seventh to twelfth count signals CNT7, CNT8, CNT9, CNT10, CNT11 and CNT12 to generate a twenty second count signal CNT22 enabled to have a logic "high" level if, for example, each of the fifth to eighth bits C_SEL1<4:8> included in the first comparison selection signals C_SEL1<1:8> has a logic "high (H)" level.

The seventh level counter 617 may receive the thirteenth to twenty second count signals CNT13, CNT14, CNT15, CNT16, CNT17, CNT18, CNT19, CNT20, CNT21 and CNT22 to generate the first detection signal DET1 enabled to have a logic "high" level if, for example, at least five among the first to eighth bits C_SEL1<1:8> included in the first comparison selection signals C_SEL1<1:8> have a logic "high (H)" level.

Hereinafter, an operation of the bit detector 121 will be described in conjunction with an example in which the first to eighth bits of the first comparison selection signals C_SEL1<1:8> are set to have logic "H", "H", "L", "L", "H", "L", "H" and "H" levels, respectively. Since all of the first and second bits C_SEL1<1:2> of the first comparison selection signals C_SEL1<1:8> have logic "H" levels, only the third count signal CNT3 among the first to third count signals CNT1, CNT2 and CNT3 may be generated to have a logic "H" level. Since the third and fourth bits C_SEL1<3:4> of the first comparison selection signals C_SEL1<1:8> have no logic "H" level, only the fourth count signal CNT4 among the fourth to sixth count signals CNT4, CNT5 and CNT6 may be generated to have a logic "H" level. Since one of the fifth and sixth bits C_SEL1<5:6> of the first comparison selection signals C_SEL1<1:8> has a logic "H" level, only the eighth count signal CNT8 among the seventh to ninth count signals CNT7, CNT8 and CNT9 may be generated to have a logic "H" level. Since each of the seventh and eighth bits C_SEL1<7:8> of the first comparison selection signals C_SEL1<1:8> has a logic "H" level, only the twelfth count signal CNT12 among the tenth to twelfth count signals CNT10, CNT11 and CNT12 may be generated to have a logic "H" level. Since two bits (i.e., the first and second bits C_SEL1<1:2>) among the first to fourth bits C_SEL1<1:4> of the first comparison selection signals C_SEL1<1:8> have a logic "H" level, only the fifteenth count signal CNT15 among the thirteenth to seventeenth count signals CNT13, CNT14, CNT15, CNT16 and CNT17 may be generated to have a logic "H" level. Since three bits (i.e., the fifth, seventh and eighth bits C_SEL1<5>, C_SEL1<7> and C_SEL1<8>) among the fifth to eighth bits C_SEL1<5:8> of the first comparison selection signals C_SEL1<1:8> have a logic "H" level, only the twenty first count signal CNT21 among the eighteenth to twenty second count signals CNT18, CNT19, CNT20, CNT21 and CNT22 may be generated to have a logic "H" level. Since the fifteenth and twenty first count signals CNT15 and CNT21 have a logic "H" level, five bits among the first to eighth bits of the first comparison selection signals C_SEL1<1:8> may be regarded as having a logic "H" level. Thus, the first detection signal DET1 may be enabled to have a logic "H" level.

The second detection signal generator 62 may generate the second detection signal DET2 enabled to have a logic "H" level if, for example, at least five bits among first to eighth bits C_SEL2<1:8> included in the second comparison selection signals C_SEL2<1:8> have a logic "H" level. The third detection signal generator 63 may generate the third detection signal DET3 enabled to have a logic "H" level if, for example, at least five bits among first to eighth bits C_SEL3<1:8> included in the third comparison selection signals C_SEL3<1:8> have a logic "H" level. The fourth detection signal generator 64 may generate the fourth detection signal DET4 enabled to have a logic "H" level if, for example, at least five bits among first to eighth bits C_SEL4<1:8> included in the fourth comparison selection signals C_SEL4<1:8> have a logic "H" level. Each of the second, third and fourth detection signal generators 62, 63 and 64 may have substantially the same configuration as the first detection signal generator 61. Thus, the detailed configurations and operations of the second, third and fourth detection signal generators 62, 63 and 64 will be omitted hereinafter.

Figure 7:
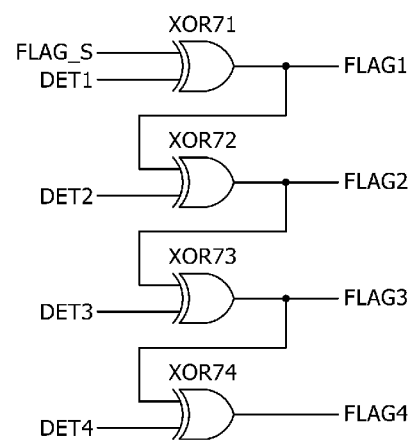
FIG. 7 is a logic circuit diagram illustrating a representation of an example of a flag generator included in the semiconductor device of FIG. 1.

Referring to FIG. 7, the flag generator 122 may include logic elements XOR71~XOR74. The logic element XOR71 may execute an exclusive OR operation of the storage flag signal FLAG_S and the first detection signal DET1 to generate the first flag signal FLAG1. The logic element XOR71 may generate the first flag signal FLAG1 having a logic "high" level if, for example, the first detection signal DET1 and the storage flag signal FLAG_S have different logic levels. The logic element XOR71 may generate the first flag signal FLAG1 having a logic "low" level if, for example, the first detection signal DET1 and the storage flag signal FLAG_S have the same logic level. The logic element XOR72 may execute an exclusive OR operation of the first flag signal FLAG1 and the second detection signal DET2 to generate the second flag signal FLAG2. The logic element XOR72 may generate the second flag signal FLAG2 having a logic "high" level if, for example, the first flag signal FLAG1 and the second detection signal DET2 have different logic levels. The logic element XOR72 may generate the second flag signal FLAG2 having a logic "low" level if, for example, the first flag signal FLAG1 and the second detection signal DET2 have the same logic level. The logic element XOR73 may execute an exclusive OR operation of the second flag signal FLAG2 and the third detection signal DET3 to generate the third flag signal FLAG3. The logic element XOR73 may generate the third flag signal FLAG3 having a logic "high" level if, for example, the second flag signal FLAG2 and the third detection signal DET3 have different logic levels. The logic element XOR73 may generate the third flag signal FLAG3 having a logic "low" level if, for example, the second flag signal FLAG2 and the third detection signal DET3 have the same logic level. The logic element XOR74 may execute an exclusive OR operation of the third flag signal FLAG3 and the fourth detection signal DET4 to generate the fourth flag signal FLAG4. The logic element XOR74 may generate the fourth flag signal FLAG4 having a logic "high" level if, for example, the third flag signal FLAG3 and the fourth detection signal DET4 have different logic levels. The logic element XOR74 may generate the fourth flag signal FLAG4 having a logic "low" level if, for example, the third flag signal FLAG3 and the fourth detection signal DET4 have the same logic level. The flag generator 122 may receive the storage flag signal FLAG_S and may sequentially compare the first to fourth detection signals DET1, DET2, DET3 and DET4 with the storage flag signal FLAG_S to execute an operation relating to a data inversion scheme in consideration of a logic level of the transmission control signal T_CON as well as logic levels of the first to eighth output data DQ<1:8> outputted from the first to eighth data output circuits 11_1, 11_2, . . . , and 11_8. For example, if logic levels of at least five bits among the transmission control signal T_CON and the first to eighth output data DQ<1:8> are changed, phases of all of the first to eighth output data DQ<1:8> may be inversed and the inversed data of the first to eighth output data DQ<1:8> may be outputted. A description of the data inversion scheme will be developed with reference to FIGS. 9, 10 and 11 later.

Figure 8:
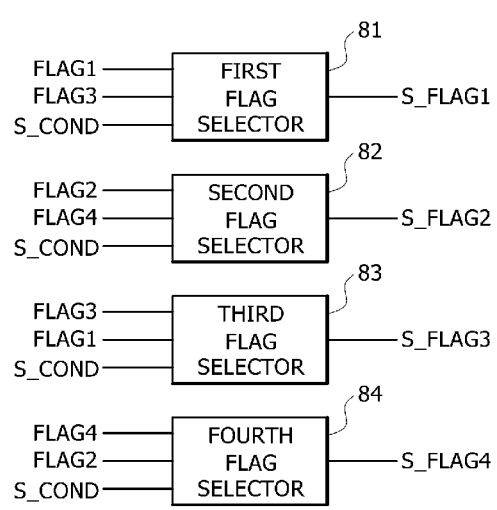
FIG. 8 is a block diagram illustrating a representation of an example of a selection flag generator included in the semiconductor device of FIG. 1.

Referring to FIG. 8, the selection flag generator 124 may include a first flag selector 81, a second flag selector 82, a third flag selector 83 and a fourth flag selector 84. The first flag selector 81 may output the first flag signal FLAG1 as the first selection flag signal S_FLAG1 if, for example, the delayed selection control signal S_COND has a logic "low" level. The first flag selector 81 may output the third flag signal FLAG3 as the first selection flag signal S_FLAG1 if, for example, the delayed selection control signal S_COND has a logic "high" level. The second flag selector 82 may output the second flag signal FLAG2 as the second selection flag signal S_FLAG2 if, for example, the delayed selection control signal S_COND has a logic "low" level. The second flag selector 82 may output the fourth flag signal FLAG4 as the second selection flag signal S_FLAG2 if, for example, the delayed selection control signal S_COND has a logic "high" level. The third flag selector 83 may output the third flag signal FLAG3 as the third selection flag signal S_FLAG3 if, for example, the delayed selection control signal S_COND has a logic "low" level. The third flag selector 83 may output the first flag signal FLAG1 as the third selection flag signal S_FLAG3 if, for example, the delayed selection control signal S_COND has a logic "high" level. The fourth flag selector 84 may output the fourth flag signal FLAG4 as the fourth selection flag signal S_FLAG4 if, for example, the delayed selection control signal S_COND has a logic "low" level. The fourth flag selector 84 may output the second flag signal FLAG2 as the fourth selection flag signal S_FLAG4 if, for example, the delayed selection control signal S_COND has a logic "high" level. In the semiconductor device according to an embodiment, the selection flag generator 124 may be employed to recover an input sequence of the first to fourth selection flag signals S_FLAG1~S_FLAG4 inputted to the second pipe latch unit 125 converting an output sequence of its output signals according to the burst sequence because the first to fourth flags FLAG1~FLAG4 are generated from the first to fourth comparison selection signals C_SEL1<1>, C_SEL2<1>, C_SEL3<1> and C_SEL4<1> which are outputted from the comparison signal selector 114 and whose output sequence is changed according to the burst sequence.

Referring to FIG. 9, logic levels of the first to eighth output data DQ<1:8> outputted from the first to eighth data output circuits 11_1, 11_2, . . . , and 11_8 and a logic level of the transmission control signal T_CON may be confirmed before the data inversion operation is executed. That is, FIG. 9 illustrates an example in which the input signals DIN1<1:8>, DIN2<1:8>, DIN3<1:8> and DIN4<1:8> sequentially inputted to the first to eighth data output circuits 11_1, 11_2, . . . , and 11_8 are outputted as the first to eighth output data DQ<1:8> without inversions. In the first output data DQ<1>, a logic level 'L' of 'PRE OUT' means that all of the first to fourth input signals DIN1<1>, DIN2<1>, DIN3<1> and DIN4<1> have a logic "low" level before the first to fourth input signals DIN1<1>, DIN2<1>, DIN3<1> and DIN4<1> are inputted to the first data output circuit 11_1. In the first output data DQ<1>, a logic level combination 'H, H, H, L' of '1st_OUT', '2nd_OUT', '3rd_OUT' and '4th_OUT' means that the first input signal DIN1<1> having a logic "high" level, the second input signal DIN2<1> having a logic "high" level, the third input signal DIN3<1> having a logic "high" level, and the fourth input signal DIN4<1> having a logic "low" level are sequentially inputted to the first data output circuit 11_1. As illustrated in FIG. 9, the number of toggled bits among the bits included in the first to eighth output data DQ<1:8> at the '1st_OUT' stage is five, and the number of toggled bits among the bits included in the first to eighth output data DQ<1:8> at the '2nd_OUT' stage is four. In addition, the number of toggled bits among the bits included in the first to eighth output data DQ<1:8> at the '3rd_OUT' stage is four, and the number of toggled bits among the bits included in the first to eighth output data DQ<1:8> at the '4th_OUT' stage is five. Moreover, the data inversion operation has not occurred yet. Thus, all of the transmission control signals T_CON may have a logic "low" level. Accordingly, the number of toggled bits among the bits included in the first to eighth output data DQ<1:8> and the transmission control signal T_CON at the '1st_OUT' stage is five, and the number of toggled bits among the bits included in the first to eighth output data DQ<1:8> and the transmission control signal T_CON at the '2nd_OUT' stage is four (i.e., Number of Level of 'DQ+T_CON'). In addition, the number of toggled bits among the bits included in the first to eighth output data DQ<1:8> and the transmission control signal T_CON at the '3rd_OUT' stage is four, and the number of toggled bits among the bits included in the first to eighth output data DQ<1:8> and the transmission control signal T_CON at the '4th_OUT' stage is five.

Referring to FIG. 10, a data inversion operation executed in consideration of the number of toggled bits among the bits included in the first to eighth output data DQ<1:8> may be confirmed. As described with reference to FIG. 9, the number of the toggled bits among the bits included in the first to eighth output data DQ<1:8> at the '1st_OUT' stage is five, and the number of the toggled bits among the bits included in the first to eighth output data DQ<1:8> at the '4th_OUT' stage is five. Thus, all of logic levels of the first to eighth output data DQ<1:8> at the '1st_OUT' stage may be inverted, and all of logic levels of the first to eighth output data DQ<1:8> at the '4th_OUT' stage may also be inverted. As a result of the above data inversion operations, the number of toggled bits among the bits included in the first to eighth output data DQ<1:8> at the '1st_OUT' stage is three, and the number of toggled bits among the bits included in the first to eighth output data DQ<1:8> at the '2nd_OUT' stage is four. In addition, the number of toggled bits among the bits included in the first to eighth output data DQ<1:8> at the '3rd_OUT' stage is four, and the number of toggled bits among the bits included in the first to eighth output data DQ<1:8> at the '4th_OUT' stage is three. In such an example, logic levels of the transmission control signals T_CON at the '1st_OUT' stage and the '4th_OUT' stage may be changed into a logic "high" level because the data inversion operation is executed at the '1st_OUT' stage and the '4th_OUT' stage. Accordingly, the number of toggled bits among the bits included in the first to eighth output data DQ<1:8> and the transmission control signal T_CON at the '1st_OUT' stage is four, and the number of toggled bits among the bits included in the first to eighth output data DQ<1:8> and the transmission control signal T_CON at the '2nd_OUT' stage is five. In addition, the number of toggled bits among the bits included in the first to eighth output data DQ<1:8> and the transmission control signal T_CON at the '3rd_OUT' stage is four, and the number of toggled bits among the bits included in the first to eighth output data DQ<1:8> and the transmission control signal T_CON at the '4th_OUT' stage is four. For example, while the number of toggled bits among the bits included in the first to eighth output data DQ<1:8> at the '2nd_OUT' stage is four, the number of toggled bits among the bits included in the first to eighth output data DQ<1:8> and the transmission control signal T_CON at the '2nd_OUT' stage is five.

Referring to FIG. 11, a data inversion operation executed in consideration of the number of toggled bits among the bits included in the first to eighth output data DQ<1:8> and the transmission control signal T_CON may be confirmed. As described with reference to FIG. 10, the number of the toggled bits among the bits included in the first to eighth output data DQ<1:8> and the transmission control signal T_CON at the '2nd_OUT' stage is five. Thus, all of logic levels of the first to eighth output data DQ<1:8> and the transmission control signal T_CON at the '2nd_OUT' stage may be inverted. As a result of the above data inversion operation, the number of toggled bits among the bits included in the first to eighth output data DQ<1:8> and the transmission control signal T_CON at the '3rd_OUT' stage may be five. Thus, all of logic levels of the first to eighth output data DQ<1:8> and the transmission control signal T_CON at the '3rd_OUT' stage may be inverted. As a result of the above data inversion operation, the number of toggled bits among the bits included in the first to eighth output data DQ<1:8> and the transmission control signal T_CON at the '4th_OUT' stage may be five. Thus, all of logic levels of the first to eighth output data DQ<1:8> and the transmission control signal T_CON at the '4th_OUT' stage may be inverted. Accordingly, the number of the toggled bits among the bits included in the first to eighth output data DQ<1:8> and the transmission control signal T_CON at the '1st_OUT' stage is four, and the number of the toggled bits among the bits included in the first to eighth output data DQ<1:8> and the transmission control signal T_CON at the '2nd_OUT' stage is four. In addition, the number of the toggled bits among the bits included in the first to eighth output data DQ<1:8> and the transmission control signal T_CON at the '3rd_OUT' stage is four, and the number of the toggled bits among the bits included in the first to eighth output data DQ<1:8> and the transmission control signal T_CON at the '4th_OUT' stage is four. The above data inversion operations may be executed by the flag generator 122 illustrated in FIG. 7.

As described above, the semiconductor device according to an embodiment may execute the data inversion operations in consideration of the number of the toggled bits among the bits included in the first to eighth output data DQ<1:8> as well as the transmission control signal T_CON. These data inversion operations may remove the SSN generated by the first to eighth output data DQ<1:8> as well as the transmission control signal T_CON, thereby improving the signal integrity of the semiconductor device.

Hereinafter, the data inversion scheme of the semiconductor device according to a burst sequence will be described in conjunction with an example in which the selection control signal S_CON has a logic "low" level.

As described with reference to FIG. 2, the first, second, third and fourth input signals DIN1<1>, DIN2<1>, DIN3<1> and DIN4<1> may be sequentially transmitted to the data pad 118 through the first pipe latch unit 115, the phase controller 116 and the data output unit 117 if the selection control signal S_CON has a logic "low" level. The fourth input signal DIN4<1> may be selected as the final datum F_DT, and the final datum F_DT may be outputted as the storage datum S_DT. The first comparison signal COM<1> generated by comparing the first input signal DIN1<1> with the storage datum S_DT may be outputted as the first comparison selection signal C_SEL1<1>, and the second comparison signal COM<2> generated by comparing the second input signal DIN2<1> with the first input signal DIN1<1> may be outputted as the second comparison selection signal C_SEL2<1>. The third comparison signal COM<3> generated by comparing the third input signal DIN3<1> with the second input signal DIN2<1> may be outputted as the third comparison selection signal C_SEL3<1>. The fourth comparison signal COM<4> generated by comparing the fourth input signal DIN4<1> with the third input signal DIN3<1> may be outputted as the fourth comparison selection signal C_SEL4<1>. Similarly, the comparison selection signals C_SEL1<2:8>, C_SEL2<2:8>, C_SEL3<2:8> and C_SEL4<2:8> may also be generated from the input signals DIN1<2:8>, DIN2<2:8>, DIN3<2:8> and DIN4<2:8> in the second to eighth data output circuits 11_1, 11_2, . . . , and 11_8.

The first detection signal DET1 enabled may be generated if the number of a logic "H" level among the logic levels of the bits included in the first comparison selection signals C_SEL1<1:8> is equal to or greater than five, and the second detection signal DET2 enabled may be generated if the number of a logic "H" level among the logic levels of the bits included in the second comparison selection signals C_SEL2<1:8> is equal to or greater than five. Similarly, the third detection signal DET3 enabled may be generated if the number of a logic "H" level among the logic levels of the bits included in the third comparison selection signals C_SEL3<1:8> is equal to or greater than five, and the fourth detection signal DET4 enabled may be generated if the number of a logic "H" level among the logic levels of the bits included in the fourth comparison selection signals C_SEL4<1:8> is equal to or greater than five.

An exclusive OR operation of the storage flag signal FLAG_S and the first detection signal DET1 may be executed to generate the first flag signal FLAG1, and an exclusive OR operation of the first flag signal FLAG1 and the second detection signal DET2 may be executed to generate the second flag signal FLAG2. An exclusive OR operation of the second flag signal FLAG2 and the third detection signal DET3 may be executed to generate the third flag signal FLAG3, and an exclusive OR operation of the third flag signal FLAG3 and the fourth detection signal DET4 may be executed to generate the fourth flag signal FLAG4. A data inversion operation may be executed by the above exclusive OR operations in consideration of the number of toggled bits among the bits included in the first to eighth output data DQ<1:8> as well as the transmission control signal T_CON.

The first flag signal FLAG1 may be outputted as the first selection flag signal S_FLAG1, and the second flag signal FLAG2 may be outputted as the second selection flag signal S_FLAG2. The third flag signal FLAG3 may be outputted as the third selection flag signal S_FLAG3, and the fourth flag signal FLAG4 may be outputted as the fourth selection flag signal S_FLAG4. The first, second, third and fourth selection flag signals S_FLAG1, S_FLAG2, S_FLAG3 and S_FLAG4 corresponding to parallel signals may be converted into the inversion control signals IV_CON which are transmitted in series, and the inversion control signals IV_CON may be outputted as the transmission control signals T_CON through the control pad 127.

Hereinafter, the data inversion scheme of the semiconductor device according to a burst sequence will be described in conjunction with an example in which the selection control signal S_CON has a logic "high" level.

As described with reference to FIG. 2, the third, fourth, first and second input signals DIN3<1>, DIN4<1>, DIN1<1> and DIN2<1> may be sequentially transmitted to the data pad 118 through the first pipe latch unit 115, the phase controller 116 and the data output unit 117 if the selection control signal S_CON has a logic "high" level. The second input signal DIN2<1> may be selected as the final datum F_DT, and the final datum F_DT may be outputted as the storage datum S_DT. The fifth comparison signal COM<5> generated by comparing the third input signal DIN3<1> with the storage datum S_DT may be outputted as the first comparison selection signal C_SEL1<1>, and the fourth comparison signal COM<4> generated by comparing the fourth input signal DIN4<1> with the third input signal DIN3<1> may be outputted as the second comparison selection signal C_SEL2<1>. The sixth comparison signal COM<6> generated by comparing the fourth input signal DIN4<1> with the first input signal DIN1<1> may be outputted as the third comparison selection signal C_SEL3<1>, and the second comparison signal COM<2> generated by comparing the second input signal DIN2<1> with the first input signal DIN1<1> may be outputted as the fourth comparison selection signal C_SEL4<1>. Similarly, the comparison selection signals C_SEL1<2:8>, C_SEL2<2:8>, C_SEL3<2:8> and C_SEL4<2:8> may also be generated from the input signals DIN1<2:8>, DIN2<2:8>, DIN3<2:8> and DIN4<2:8> in the second to eighth data output circuits 11_1, 11_2, . . . , and 11_8.

The first detection signal DET1 enabled may be generated if the number of a logic "H" level among the logic levels of the bits included in the first comparison selection signals C_SEL1<1:8> is equal to or greater than five. The second detection signal DET2 enabled may be generated if the number of a logic "H" level among the logic levels of the bits included in the second comparison selection signals C_SEL2<1:8> is equal to or greater than five. Similarly, the third detection signal DET3 enabled may be generated if the number of a logic "H" level among the logic levels of the bits included in the third comparison selection signals C_SEL3<1:8> is equal to or greater than five. The fourth detection signal DET4 enabled may be generated if the number of a logic "H" level among the logic levels of the bits included in the fourth comparison selection signals C_SEL4<1:8> is equal to or greater than five.

An exclusive OR operation of the storage flag signal FLAG_S and the first detection signal DET1 may be executed to generate the first flag signal FLAG1, and an exclusive OR operation of the first flag signal FLAG1 and the second detection signal DET2 may be executed to generate the second flag signal FLAG2. An exclusive OR operation of the second flag signal FLAG2 and the third detection signal DET3 may be executed to generate the third flag signal FLAG3, and an exclusive OR operation of the third flag signal FLAG3 and the fourth detection signal DET4 may be executed to generate the fourth flag signal FLAG4. A data inversion operation may be executed by the above exclusive OR operations in consideration of the number of toggled bits among the bits included in the first to eighth output data DQ<1:8> as well as the transmission control signal T_CON.

The third flag signal FLAG3 may be outputted as the first selection flag signal S_FLAG1, and the fourth flag signal FLAG4 may be outputted as the second selection flag signal S_FLAG2. The first flag signal FLAG1 may be outputted as the third selection flag signal S_FLAG3, and the second flag signal FLAG2 may be outputted as the fourth selection flag signal S_FLAG4. The first, second, third and fourth selection flag signals S_FLAG1, S_FLAG2, S_FLAG3 and S_FLAG4 corresponding to parallel signals may be converted into the inversion control signals IV_CON which are transmitted in series, and the inversion control signals IV_CON may be outputted as the transmission control signals T_CON through the control pad 127.

As described above, a semiconductor device according to an embodiment may execute a data inversion operation according to a burst sequence without design changes.

Figure 12:
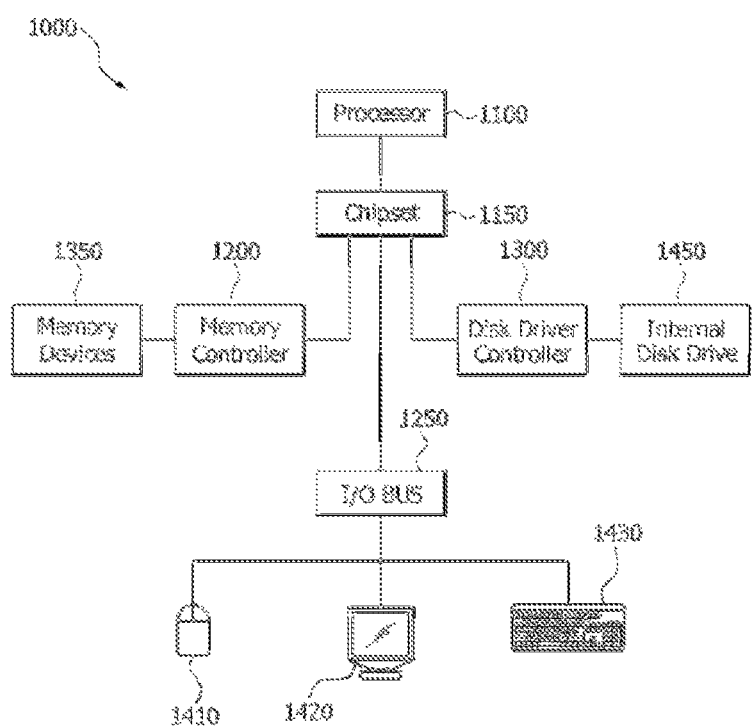
FIG. 12 illustrates a block diagram of an example of a representation of a system employing a semiconductor device in accordance with the various embodiments discussed above with relation to FIGS. 1-11.

The semiconductor devices discussed above (see FIGS. 1-11) are particular useful in the design of memory devices, processors, and computer systems. For example, referring to FIG. 12, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-11. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a system 1000 employing a semiconductor device as discussed above with relation to FIGS. 1-11. In alternate embodiments, such as, for example but not limited to, cellular phones or digital cameras, the components may differ from the embodiments illustrated in FIG. 12.

What is claimed is:

1. A semiconductor device comprising:
    a data output circuit suitable for comparing a first input signal with a storage datum to generate a first comparison selection signal and comparing a second input signal with the first input signal to generate a second comparison selection signal in a first output sequence mode that the first input signal and the second input signal are sequentially outputted as output data and suitable for comparing the second input signal with the storage datum to generate the first comparison selection signal and comparing the second input signal with the first input signal to generate the second comparison selection signal in a second output sequence mode that the second input signal and the first input signal are sequentially outputted as the output data; and
    a control signal output circuit suitable for detecting logic levels of bits included in the first and second comparison selection signals to generate a first detection signal and a second detection signal, suitable for generating a first flag signal and a second flag signal from the first and second detection signals in response to a storage flag signal, and suitable for sequentially outputting the first and second flag signals as transmission control signals.

2. The semiconductor device of claim 1, wherein the first and second input signals are sequentially inputted to the data output circuit again after the second input signal is stored as the storage datum in the first output sequence mode.

3. The semiconductor device of claim 1, wherein the second and first input signals are sequentially inputted to the data output circuit again after the first input signal is stored as the storage datum in the second output sequence mode.

4. The semiconductor device of claim 1, wherein the data output circuit includes a data storage unit suitable for storing the second input signal as the storage datum in the first output sequence mode and suitable for storing the first input signal as the storage datum in the second output sequence mode.

5. The semiconductor device of claim 1, wherein the data output circuit includes a data comparator suitable for comparing the first input signal with the storage datum to generate a first comparison signal, suitable for comparing the second input signal with the first input signal to generate a second comparison signal, and suitable for comparing the second input signal with the storage datum to generate a third comparison signal.

6. The semiconductor device of claim 5, wherein the data output circuit further includes a comparison signal selector suitable for outputting the first comparison signal as the first comparison selection signal and outputting the second comparison signal as the second comparison selection signal in the first output sequence mode and suitable for outputting the third comparison signal as the first comparison selection signal and outputting the second comparison signal as the second comparison selection signal in the second output sequence mode.

7. The semiconductor device of claim 1, wherein the data output circuit includes a pipe latch unit suitable for sequentially latching the first and second input signals in response to an input control signal and suitable for outputting the latched first and second input signals as pipe latch data in response to an output control signal.

8. The semiconductor device of claim 7,
wherein the pipe latch unit outputs the latched second input signal as the pipe latch data after the latched first input signal is outputted as the pipe latch data in the first output sequence mode; and
wherein the pipe latch unit outputs the latched first input signal as the pipe latch data after the latched second input signal is outputted as the pipe latch data in the second output sequence mode.

9. The semiconductor device of claim 7, wherein the data output circuit includes further includes:
a phase controller suitable for determining a phase inversion of the pipe latch data in response to an inversion control signal to generate a phase data; and
a data output unit suitable for generating the output data from the phase data in synchronization with an internal clock signal,
wherein the output data is outputted through a data pad.

10. The semiconductor device of claim 1, wherein the control signal output circuit includes a bit detector suitable for detecting logic levels of bits included in the first comparison selection signal to generate the first detection signal and suitable for detecting logic levels of bits included in the second comparison selection signal to generate the second detection signal.

11. The semiconductor device of claim 1, wherein the control signal output circuit includes:
a flag generator suitable for comparing the first detection signal with the storage flag signal to generate the first flag signal and suitable for comparing the first flag signal with the second detection signal to generate the second flag signal; and
a flag storage unit suitable for storing the second flag signal as the storage flag signal in response to a delayed storage control signal.

12. The semiconductor device of claim 1, wherein the control signal output circuit includes a selection flag generator suitable for outputting the first flag signal as the first selection flag signal and outputting the second flag signal as the second selection flag signal in the first output sequence mode and suitable for outputting the second flag signal as the first selection flag signal and outputting the first flag signal as the second selection flag signal in the second output sequence mode.

13. The semiconductor device of claim 12, wherein the control signal output circuit further includes a pipe latch unit suitable for sequentially latching the first and second selection flag signals in response to a delayed input control signal and suitable for outputting the latched first and second selection flag signals as inversion control signals in response to a delayed output control signal.

14. The semiconductor device of claim 13,
wherein the pipe latch unit outputs the latched second selection flag signal as the inversion control signal after the latched first selection flag signal is outputted as the inversion control signal in the first output sequence mode; and
wherein the pipe latch unit outputs the latched first selection flag signal as the inversion control signal after the latched second selection flag signal is outputted as the inversion control signal in the second output sequence mode.

15. The semiconductor device of claim 13,
wherein the control signal output circuit further includes a control signal output unit suitable for generating the transmission control signals from the inversion control signals in synchronization with an internal clock signal; and
wherein the transmission control signals are outputted through a control pad.

16. A semiconductor device comprising:
a first pipe latch unit suitable for sequentially latching a first input signal and a second input signal in response to an input control signal and suitable for outputting the latched first and second input signals as pipe latch data in response to an output control signal;
a data storage unit suitable for storing the second input signal as a storage datum in a first output sequence mode and suitable for storing the first input signal as the storage datum in a second output sequence mode;
a data comparator suitable for comparing the first input signal with the storage datum to generate a first comparison signal, suitable for comparing the second input signal with the first input signal to generate a second comparison signal, and suitable for comparing the second input signal with the storage datum to generate a third comparison signal;
a comparison signal selector suitable for outputting the first comparison signal as the first comparison selection signal and outputting the second comparison signal as the second comparison selection signal in the first output sequence mode and suitable for outputting the third comparison signal as the first comparison selection signal and outputting the second comparison signal as the second comparison selection signal in the second output sequence mode; and
a control signal output circuit suitable for detecting logic levels of bits included in the first and second comparison selection signals to generate a first detection signal and a second detection signal, suitable for generating a first flag signal and a second flag signal from the first and second detection signals in response to a storage flag signal, and suitable for sequentially outputting the first and second flag signals as transmission control signals.

17. The semiconductor device of claim 16,
wherein the first pipe latch unit outputs the latched second input signal as the pipe latch data after the latched first input signal is outputted as the pipe latch data in the first output sequence mode; and
wherein the first pipe latch unit outputs the latched first input signal as the pipe latch data after the latched second input signal is outputted as the pipe latch data in the second output sequence mode.

18. The semiconductor device of claim 16, further comprising:
   a phase controller suitable for determining a phase inversion of the pipe latch data in response to an inversion control signal to generate a phase data; and
   a data output unit suitable for generating output data from the phase data in synchronization with an internal clock signal,
   wherein the output data is outputted through a data pad.

19. The semiconductor device of claim 16, wherein the control signal output circuit includes a bit detector suitable for detecting logic levels of bits included in the first comparison selection signal to generate the first detection signal and suitable for detecting logic levels of bits included in the second comparison selection signal to generate the second detection signal.

20. The semiconductor device of claim 16, wherein the control signal output circuit includes:
   a flag generator suitable for comparing the first detection signal with the storage flag signal to generate the first flag signal and suitable for comparing the first flag signal with the second detection signal to generate the second flag signal; and
   a flag storage unit suitable for storing the second flag signal as the storage flag signal in response to a delayed storage control signal.

21. The semiconductor device of claim 16, wherein the control signal output circuit includes a selection flag generator suitable for outputting the first flag signal as a first selection flag signal and outputting the second flag signal as a second selection flag signal in the first output sequence mode and suitable for outputting the second flag signal as the first selection flag signal and outputting the first flag signal as the second selection flag signal in the second output sequence mode.

22. The semiconductor device of claim 21, wherein the control signal output circuit further includes a second pipe latch unit suitable for sequentially latching the first and second selection flag signals in response to a delayed input control signal and suitable for outputting the latched first and second selection flag signals as inversion control signals in response to a delayed output control signal.

23. The semiconductor device of claim 22,
   wherein the second pipe latch unit outputs the latched second selection flag signal as the inversion control signal after the latched first selection flag signal is outputted as the inversion control signal in the first output sequence mode; and
   wherein the second pipe latch unit outputs the latched first selection flag signal as the inversion control signal after the latched second selection flag signal is outputted as the inversion control signal in the second output sequence mode.

24. The semiconductor device of claim 22,
   wherein the control signal output circuit further includes a control signal output unit suitable for generating the transmission control signals from the inversion control signals in synchronization with an internal clock signal; and
   wherein the transmission control signals are outputted through a control pad.

25. A semiconductor device comprising:
   a data output circuit suitable for comparing a first input signal with a storage datum to generate a first comparison selection signal and comparing a second input signal with the first input signal to generate a second comparison selection signal in a first output sequence mode that the first input signal and the second input signal are sequentially outputted as output data and suitable for comparing the second input signal with the storage datum to generate the first comparison selection signal and comparing the second input signal with the first input signal to generate the second comparison selection signal in a second output sequence mode that the second input signal and the first input signal are sequentially outputted as the output data;
   a bit detector suitable for detecting logic levels of bits included in the first comparison selection signal to generate a first detection signal and suitable for detecting logic levels of bits included in the second comparison selection signal to generate a second detection signal;
   a flag generator suitable for comparing the first detection signal with a storage flag signal to generate a first flag signal and suitable for comparing the first flag signal with the second detection signal to generate a second flag signal;
   a flag storage unit suitable for storing the second flag signal as the storage flag signal in response to a delayed storage control signal;
   a selection flag generator suitable for outputting the first flag signal as a first selection flag signal and outputting the second flag signal as a second selection flag signal in the first output sequence mode and suitable for outputting the second flag signal as the first selection flag signal and outputting the first flag signal as the second selection flag signal in the second output sequence mode;
   a first pipe latch unit suitable for sequentially latching the first and second selection flag signals in response to a delayed input control signal and suitable for outputting the latched first and second selection flag signals as inversion control signals in response to a delayed output control signal; and
   a control signal output unit suitable for generating transmission control signals from the inversion control signals in synchronization with an internal clock signal,
   wherein the transmission control signals are outputted through a control pad.

26. The semiconductor device of claim 25, wherein the data output circuit includes a data comparator suitable for comparing the first input signal with the storage datum to generate a first comparison signal, suitable for comparing the second input signal with the first input signal to generate a second comparison signal, and suitable for comparing the second input signal with the storage datum to generate a third comparison signal.

27. The semiconductor device of claim 26, wherein the data output circuit further includes a comparison signal selector suitable for outputting the first comparison signal as the first comparison selection signal and outputting the second comparison signal as the second comparison selection signal in the first output sequence mode and suitable for outputting the third comparison signal as the first comparison selection signal and outputting the second comparison signal as the second comparison selection signal in the second output sequence mode.

28. The semiconductor device of claim 25, wherein the data output circuit includes a second pipe latch unit suitable for sequentially latching the first and second input signals in response to an input control signal and suitable for outputting the latched first and second input signals as pipe latch data in response to an output control signal.

29. The semiconductor device of claim 28, wherein the data output circuit includes further includes:
- a phase controller suitable for determining a phase inversion of the pipe latch data in response to the inversion control signal to generate a phase data; and
- a data output unit suitable for generating the output data from the phase data in synchronization with the internal clock signal,
- wherein the output data is outputted through a data pad.

30. The semiconductor device of claim 25,
- wherein the first pipe latch unit outputs the latched second selection flag signal as the inversion control signal after the latched first selection flag signal is outputted as the inversion control signal in the first output sequence mode; and
- wherein the first pipe latch unit outputs the latched first selection flag signal as the inversion control signal after the latched second selection flag signal is outputted as the inversion control signal in the second output sequence mode.

* * * * *